United States Patent
Vadi

(10) Patent No.: US 11,195,797 B2
(45) Date of Patent: Dec. 7, 2021

(54) APPLICATIONS OF BURIED POWER RAILS

(71) Applicant: Samsung Electronics Co., Ltd., Suwon-si (KR)

(72) Inventor: Vasisht M. Vadi, San Diego, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/561,006

(22) Filed: Sep. 4, 2019

(65) Prior Publication Data
US 2020/0373240 A1   Nov. 26, 2020

Related U.S. Application Data

(60) Provisional application No. 62/851,094, filed on May 21, 2019.

(51) Int. Cl.
| H01L 23/528 | (2006.01) |
| H01L 27/02 | (2006.01) |
| H01L 23/522 | (2006.01) |

(52) U.S. Cl.
CPC ...... H01L 23/5286 (2013.01); H01L 23/5226 (2013.01); H01L 23/5283 (2013.01); H01L 27/0207 (2013.01)

(58) Field of Classification Search
CPC . H01L 23/5286; H01L 23/5226; H01L 23/50; H01L 23/5283; H01L 2027/11881
See application file for complete search history.

(56) References Cited

U.S. PATENT DOCUMENTS

| 6,492,244 | B1* | 12/2002 | Christensen | ...... H01L 21/76243 |
| | | | | 438/404 |
| 6,498,057 | B1* | 12/2002 | Christensen | .......... H01L 21/743 |
| | | | | 257/E21.538 |
| 6,667,518 | B2* | 12/2003 | Christensen | .......... H01L 21/743 |
| | | | | 257/350 |
| 9,716,036 | B2* | 7/2017 | Chang | ............... H01L 21/76895 |
| 10,636,739 | B2* | 4/2020 | Beyne | ................. H01L 23/5226 |
| 2017/0294448 | A1 | 10/2017 | Debacker et al. | |
| 2018/0145030 | A1* | 5/2018 | Beyne | ............. H01L 21/823821 |
| 2018/0190670 | A1 | 7/2018 | Ryckaert et al. | |
| 2018/0374791 | A1 | 12/2018 | Smith et al. | |
| 2019/0057867 | A1 | 2/2019 | Smith et al. | |
| 2019/0058036 | A1 | 2/2019 | Smith et al. | |
| 2019/0080969 | A1 | 3/2019 | Tsao | |

* cited by examiner

*Primary Examiner* — David A Zarneke
(74) *Attorney, Agent, or Firm* — Renaissance IP Law Group LLP

(57) ABSTRACT

A semiconductor device includes a substrate, one or more transistors, a metal layer, one or more buried power rails, and at least one wall-via structure. The transistors and the metal layer are manufactured above a top surface of the substrate. The buried power rails are in one or more corresponding trenches in the substrate below the top surface of the substrate. At least one wall-via structure extends between the first buried power rail and the metal layer and electrically connects the first buried power rail to the metal layer. The wall-via structure includes a plurality of intermediate metal layers sandwiched between the first buried power rail and the metal layer. Alternatively, the wall-via structure includes a length that is greater than or equal to four times a basic length unit for components in layers between the first buried power rail and the metal layer for the semiconductor device.

20 Claims, 8 Drawing Sheets

VIEW A-A'

VIEW A-A'

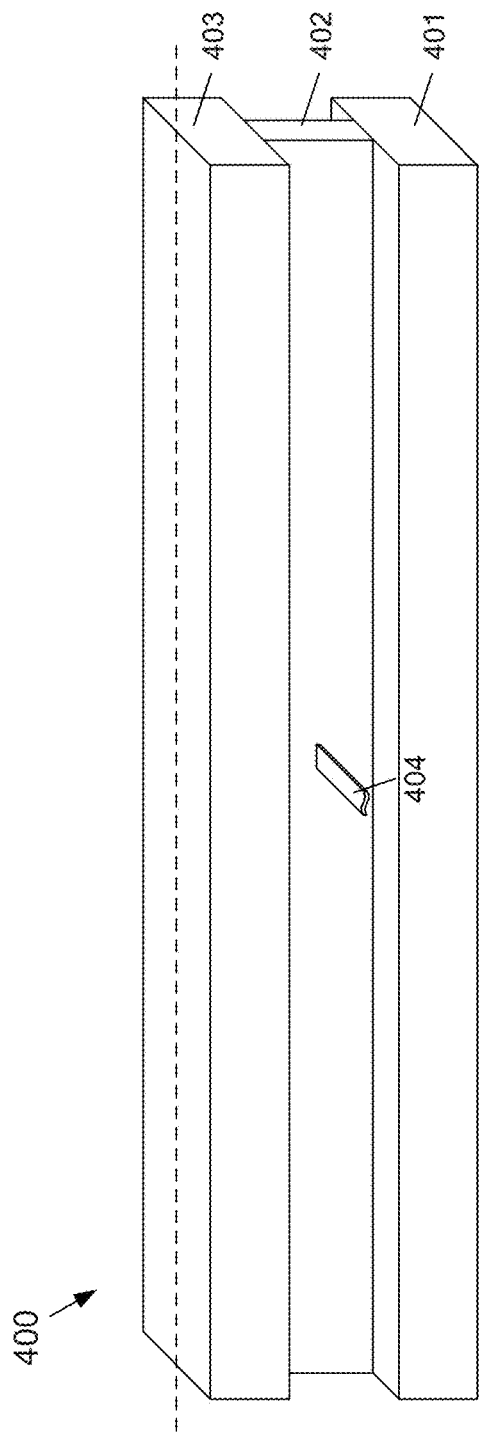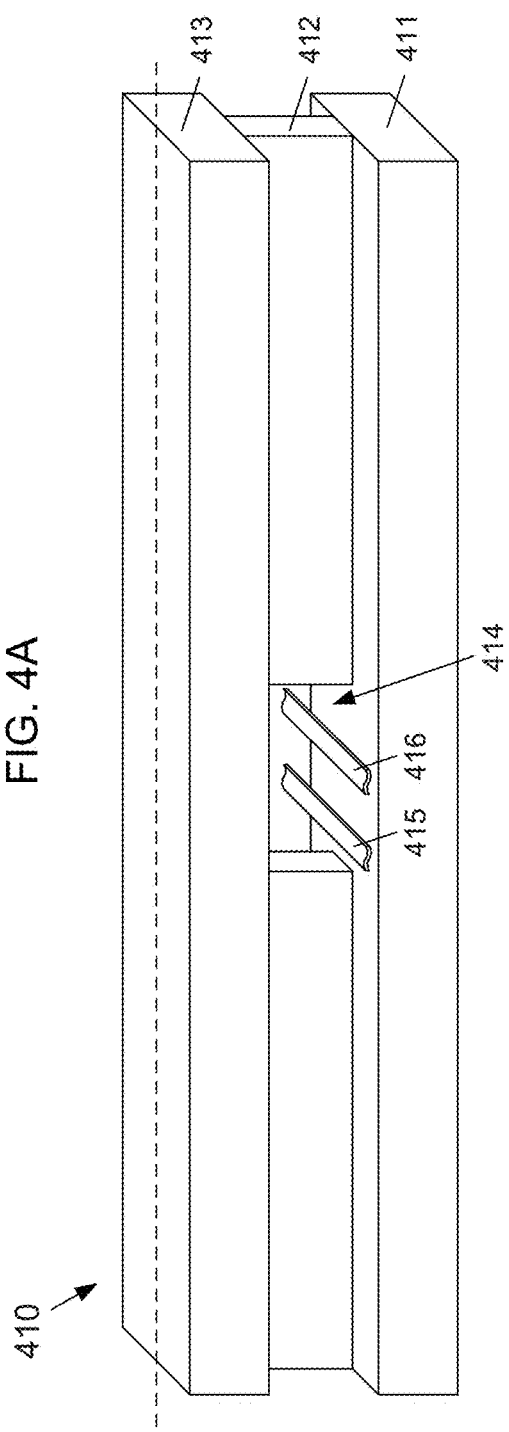

APPLICATIONS OF BURIED POWER RAILS

CROSS-REFERENCE TO RELATED APPLICATION

This application claims the priority benefit under 35 U.S.C. § 119(e) of U.S. Provisional Application No. 62/851,094 filed on May 21, 2019, the disclosure of which is incorporated herein by reference in its entirety.

TECHNICAL FIELD

The subject matter disclosed herein relates to semiconductor devices. More specifically, the subject matter disclosed herein relates to a semiconductor device that includes one or more buried power rails (BPRs).

BACKGROUND

As technology nodes and dimensions shrink, it is becoming harder to shrink the area of standard-cell (stdcell) libraries. In a modern FinFET technology node, such as SLPE, the height of a standard cell in a vertical dimension (y) is minimized in a 6T library, which only allows four signal-routing tracks and includes two metal power grid tracks that may supply enough current without having electromigration (EM) and/or IR (current-resistance) drop issues. In a horizontal dimension (x), the contact-to-poly pitch (CPP) is also scaling more slowly across technology nodes, and in some cases is not scaling. Additionally, the number of CPP per function may have also been fully optimized and it may be difficult to find ways to further shrink the cells in the horizontal dimension (x).

As standard-cell libraries have shrunk, the power grid has taken proportionally more space and a tradeoff has arisen between power delivery to the cells of a standard-cell device and routing metal tracks on a chip, which are blocked by a power grid, not to mention EM and/or IR issues as the size of the power grid traces shrink and current densities per fin increase.

SUMMARY

An example embodiment provides a semiconductor device that may include a substrate, one or more transistors, a metal layer, one or more buried power rails, and at least one wall-via structure. The substrate may have a top surface. The one or more transistors may be disposed above the top surface of the substrate. The metal layer may be disposed above the top surface of the substrate. The one or more buried power rails may be in one or more corresponding trenches in the substrate below the top surface of the substrate in which a first buried power rail may be at a first predetermined electrical potential. The at least one wall-via structure may extend between the first buried power rail and the metal layer, the wall-via structure electrically connecting the first buried power rail to the metal layer. In one embodiment, the wall-via structure may include a plurality of intermediate metallization, middle end of line (MEOL) or middle of line (MOL) layers sandwiched between the first buried power rail and the metal layer. In another embodiment, the wall-via structure may include a length extending in a direction that is substantially perpendicular to a direction extending between the first buried power rail and the metal layer and that is greater than or equal to 4 times a basic length unit for components in layers between the first buried power rail and the metal layer in which the basic length unit may be half of a smallest middle of the line (MEOL) pitch based on minimum spacing design rules for the semiconductor device.

An example embodiment provides a standard-cell semiconductor device that may include a substrate, one or more transistors, a metal layer, one or more buried power rails, and a wall-via structure. The substrate may have a top surface. The one or more transistors may be disposed above the top surface of the substrate. The metal layer may be disposed above the top surface of the substrate. The one or more buried power rails may be in one or more corresponding trenches in the substrate below the top surface of the substrate in which a first buried power rail may be at a first power supply voltage, and a second buried power rail may be at a ground potential. The wall-via structure may extend between the first buried power rail and a first trace in the metal layer in which the wall-via structure may electrically connect the first buried power rail to the first trace in the metal layer, and in which the wall-via structure may include a plurality of intermediate metal layers sandwiched between the first buried power rail and the metal layer. In one embodiment, the wall-via structure may further include a length extending in a direction that is substantially perpendicular to a direction extending between the first buried power rail and the metal layer and that is greater than or equal to 4 times a basic length unit for components in layers between the first buried power rail and the metal layer in which the basic length unit may be half of a smallest middle of the line (MEOL) pitch based on minimum spacing design rules for the standard-cell semiconductor device. In another embodiment, the first power supply voltage may include an output voltage of one of an on-die generated local power supply, a power-switched, and power-gated power supply.

An example embodiment provides a semiconductor device that may include a substrate, one or more transistors, a metal layer, one or more buried power rails, and a wall-via structure. The substrate may have a top surface. The one or more transistors may be disposed above the top surface of the substrate. The metal layer may be disposed above the top surface of the substrate. The one or more buried power rails may be in one or more corresponding trenches in the substrate below the top surface of the substrate in which a first buried power rail may be coupled to a first predetermined electrical potential. The wall-via structure may extend between the first buried power rail and a first trace in the metal layer in which the wall-via structure may electrically connect the first buried power rail to the first trace in the metal layer, and in which the wall-via structure may include a length extending in a direction that is substantially perpendicular to a direction extending between the first buried power rail and the metal layer and that is greater than or equal to 4 times a basic length unit for components in layers between the first buried power rail and the metal layer, in which the basic length unit may be half of a smallest middle of the line (MEOL) pitch based on minimum spacing design rules for the semiconductor device. In one embodiment, the semiconductor device may include one or more buried signal lines in one or more corresponding trenches in the substrate below the top surface of the substrate in which at least one of the buried signal lines may be electrically coupled to the semiconductor device.

BRIEF DESCRIPTION OF THE DRAWING

In the following section, the aspects of the subject matter disclosed herein will be described with reference to exemplary embodiments illustrated in the figure, in which:

FIGS. 4A-4D depict example configurations a BPR and a wall-via structure according to the subject matter disclosed herein;

DETAILED DESCRIPTION

Figure 1A:
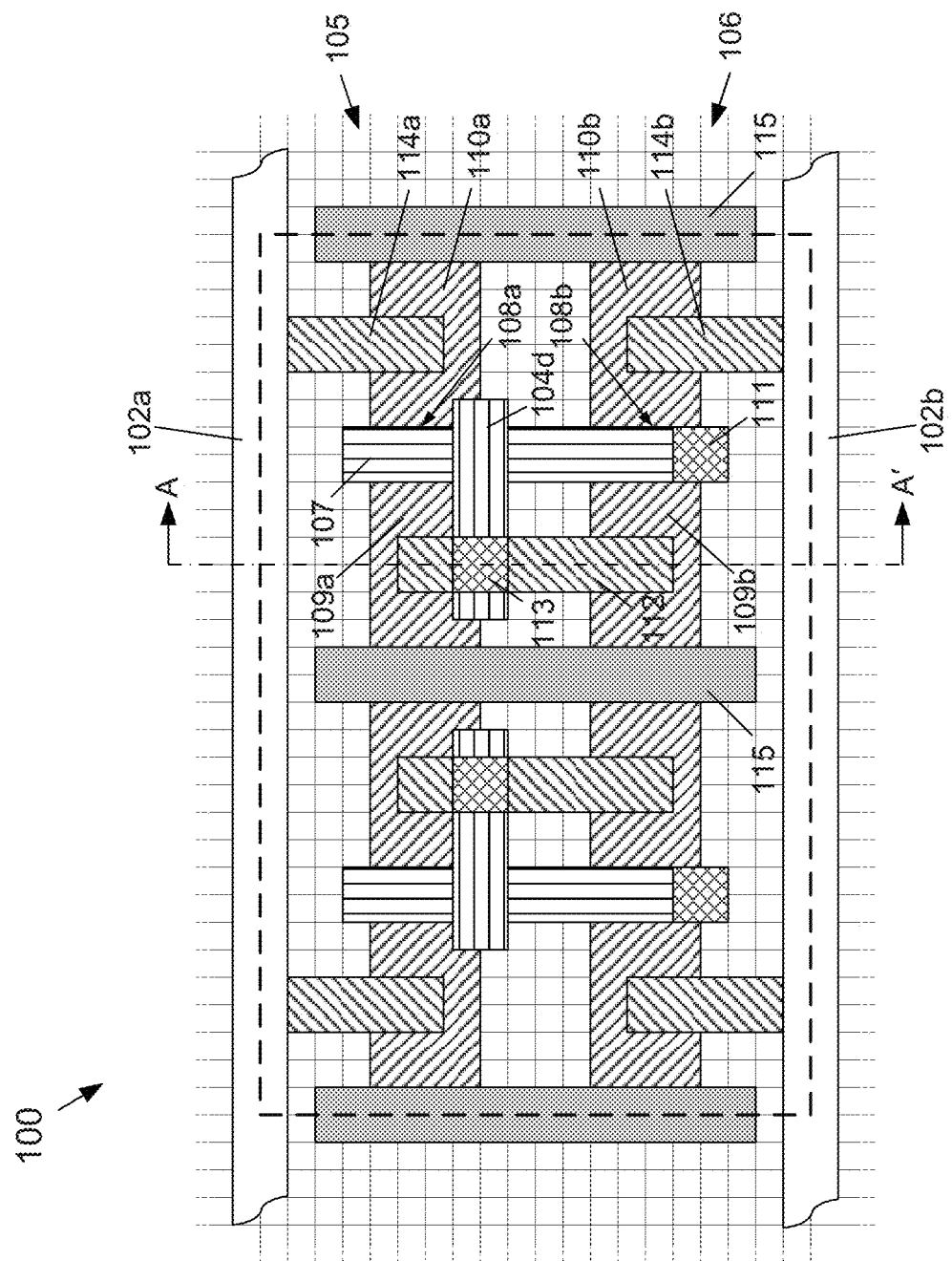
FIG. 1A is a plan view of an example embodiment of a standard cell that includes BPRs according to the subject matter disclosed herein

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. The software may be embodied as a software package, code and/or instruction set or instructions, and the term "hardware," as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC) and so forth. The various components and/or functional blocks disclosed herein may be embodied as modules that may include software, firmware and/or hardware that provide functionality described herein in connection with the various components and/or functional blocks.

The subject matter disclosed herein provides a BPR technique for semiconductor devices. In one embodiment, one or more power rails are buried in a semiconductor substrate by forming corresponding trenches below the surface of the semiconductor substrate, and filling the trenches with a conductive material, such as, but not limited to a metal. A wall-via structure may be formed on a BPR and may be used to connect the BPR to a metal layer formed above the surface of the semiconductor substrate. In one embodiment, the active area of a transistor formed in a standard cell may be moved towards the middle of the cell to accommodate the BPR and wall-via structure technique disclosed herein. Additionally, a given BPR may be shared, or accessed, by standard cells on both sides of a BPR. When implemented in standard-cell devices, the BPR technique disclosed herein allows for fabrication of a five-track (5T) library having reasonable EM and IR drop characteristics. In some embodiments, a BPR-type technique may be used to carry signals, thereby increasing the number of signals that may be coupled to a functional component of a semiconductor device.

Figure 1B:
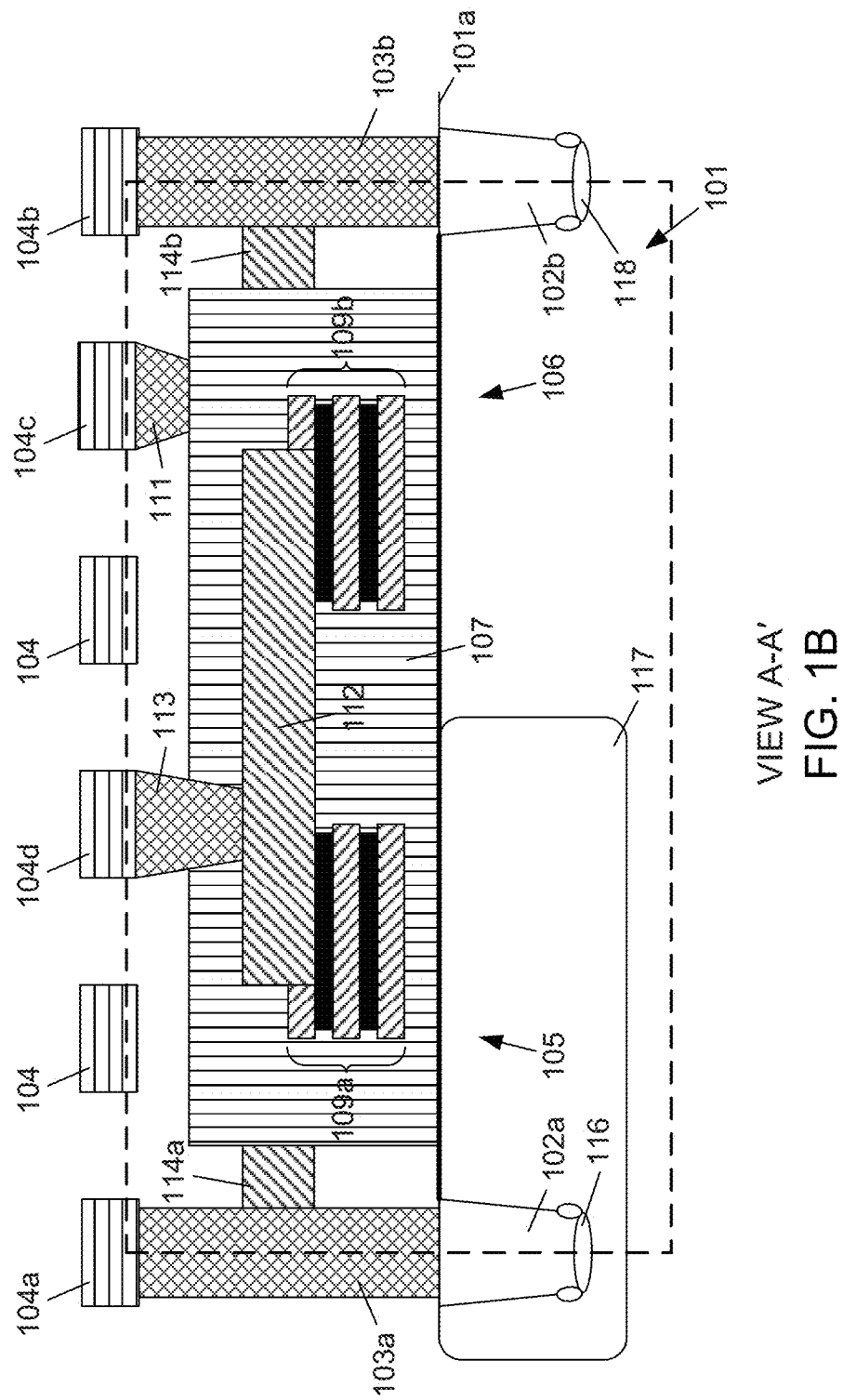
FIG. 1B is a cross-sectional view of the standard cell taken along line A-A' in FIG. 1A.

FIG. 1A is a plan view of an example embodiment of a standard cell 100 that includes BPRs according to the subject matter disclosed herein. FIG. 1B is a cross-sectional view of the standard cell 100 taken approximately along line A-A' in FIG. 1A. The dashed line appearing in both FIGS. 1A and 1B represents a boundary of the standard cell 100. Although FIGS. 1A and 1B depict a standard cell 100, the subject matter disclosed herein is not limited for use with standard cells and may be used with other semiconductor device technologies and architectures.

Referring to both FIGS. 1A and 1B, the standard cell 100 may be formed on a substrate 101 and may include BPR 102*a* and 102*b* and wall-via structures 103*a* and 103*b*. A standard cell is considered in an xy plane in which height is referred to as y, or a vertical direction; CPP is x, or horizontal direction; and metallization/Back End Of Line (BEOL) is in the z direction. The BPR 102*a* and 102*b* may be formed in corresponding trench structures below a top surface 101*a* of the substrate 101. The wall-via structures 103*a* and 103*b* respectively connect the BPR 102*a* and 102*b* to one or more metallizations or traces 104*a* and 104*b* in a metal layer 104 that may be formed above the top surface 101*a* of the substrate 101. The components of the standard cell 100 may be fabricated above the top surface 101*a* of the substrate 101.

A wall-via structure 103 may be an "extended sandwich" between the first metallization layer (usually called M1) and a BPR 102, and may be formed from one or more conducting layers, usually middle end of line (MEOL) conducting layers. For example, the one or more conducting layers between the first metallization layer and the BPR 102 may be considered intermediate layers with respect to the first metallization layer and the BPR 102. A wall-via structure may additionally or alternatively be a structure having a contiguous length extending in a direction (for example, x) that is perpendicular to a direction extending between the first metallization layer (for example, M1 or M0) and the BPR 102 (for example in direction z) and that is greater than N times a basic length unit for MEOL and metal components in layers between which the wall-via structure extends, in which N≥4. The basic length unit may be defined as half of the MEOL pitch based on minimum spacing design rules allowed in that technology. The MEOL pitch may be defined as the minimum width+minimum space for the smallest MEOL layer, so the basic unit equals ((min width)+(min space))/2. Hence, the basic unit may represent the average of two things: 1) the minimum width of the smallest MEOL layer or intermediate metallization layer in that technology, and 2) the minimum space of the smallest MEOL layer or intermediate metallization layer in that technology. A wall-via structure 102 may have multiple optional breaks and/or optional apertures in the extended sandwich. A wall-via structure 102 may also be a series of perpendicular pillars having gaps in between if such a structural configuration provides an advantage over a continuous wall. From a resistance point of view, a continuous wall-via structure 102 may be preferable. For example, from a reducing capacitance point of view, a series of pillars or a wall having gaps may be more advantageous. Apertures in a wall-via structure may be advantageous to allow MEOL routing in a vertical, or y direction, between cells to go through the wall-via structure without shorting to the wall-via structure. The apertures may be in one or more MEOL (or metal or other intermediate) layers as needed, intentionally coaligned or intentionally misaligned in each layer as per convenience.

All of the embodiments of wall-via structures disclosed herein may be collectively referred to as wall vias or wall-via structures. Also, the term "via" may be sometimes used to represent multiple MEOL layers also called MOL (middle of the line) and may be given names, such as CA/CB, V0 (via0), Vg (via for gate), Vsd (via for source/drain, intermediate metal layer below M1 or contact layers, etc., in different manufacturing technologies. Hence, as used herein, the terms "MEOL" "via" and "contact" are used in a generic definition sense to represent lower level connectivity or conducting material layer between BEOL layers and front end of line (FEOL) layers in semiconductor manufacturing.

The wall-via structures 103*a* and 103*b* may be formed from one or more MEOL, contact and/or via layers depending on the fabrication technology. In one embodiment, a wall-via structure 103 may be a "sandwich" of layers each fabricated independently or deposited all together in a merged fabrication step depending on manufacturing preference based on considerations such as, but not limited to, the number of masks needed, processing complexity, yield, electrical characteristics and/or ease of fabrication. An advantage of using a wall-via structure 103 that is shared between adjacent stdcells may be to improve process margin/yield and also provided a reduced electrical resistance relative to using many separate small vias to make electrical connections for each stdcell.

As depicted in FIGS. 1A and 1B, the standard cell 100 may be configured as an inverter. For clarity only half of the components forming the inverter are indicated in FIGS. 1A and 1B. The portion of the inverter indicated in FIGS. 1A and 1B may include a p-channel metal-oxide-semiconductor field effect (pmos) transistor 105 and an n-channel metaloxide-semiconductor field effect (nmos) transistor 106. The inverter of the standard cell 100 may include a gate structure 107 and channel structures 108a and 108b. In one embodiment, the gate structure 107 may be an all-around gate (AAG) gate structure, and the channel structures 108a and 108b may be nanowires and/or nanosheets. As viewed in FIG. 1B, the respective drain regions 109a and 109b of the transistors 105 and 106 are located in front of the gate structure 107, and the respective source regions 110a and 110b of the transistors 105 and 106 are located behind the gate structure 107. Although an AAG gate structure or a multi-bridge channel field effect transistor (MBCFET) structure may be depicted in FIGS. 1A and 1B, it should be understood that the subject matter disclosed herein may also be applied to FinFET devices in stdcell libraries with one or more fins for nmos/pmos devices, or any other alternative transistor technology. Additionally, although an inverter is depicted as an example, it should be understood that the standard cell 100 depicted in FIGS. 1A and 1B may be configured as any functional component, circuit or logic cell.

The gate structure 107 may be connected to a trace 104c through a via, an MEOL or a contact structure 111. The drain regions 109a and 109b may be connected together by a metallization 112 and to a trace 104d through a via, a MEOL or a contact structure 113. The source region 110a of the pmos transistor 105 may be connected to the wall-via structure 103a through a metallization 114a, and the source region 110b of the nmos transistor 106 may be connected to the wall-via structure 103b through a metallization 114b. The metallizations 112, 114 and 115 may be formed during a middle-end-of-line (MEOL) process as the inverter is fabricated and may be deposited/lithographed/etched in multiple process steps or in a single merged step as needed depending on manufacturing preference. To connect the well/substrate to the desired potential or to prevent latch up, a well-tie structure 116 may be fabricated in conjunction with a BPR 102a to provide a well tie to an n-well 117. Similarly, a substrate-tie or well tie structure 118 depending on the application may be fabricated in a BPR 102b to provide a tie to either the substrate or else in a triple well process as a well tie to a p-well (not shown). Such contact layers or liner layers 116/118 of different form and shape may be optional depending on design need, need for well tie or substrate tie, or for manufacturing process needs.

Note that in FIG. 1A, the metal layer 104 and/or the traces of metal layer 104 are not shown, except for trace 104d. Additionally, as depicted in FIG. 1A, the standard cell 100 may include one or more diffusion breaks 115. In FIG. 1B, there may be one or more components or layers normally associated with semiconductor devices that are not shown for clarity of the subject matter disclosed herein.

Figure 2:
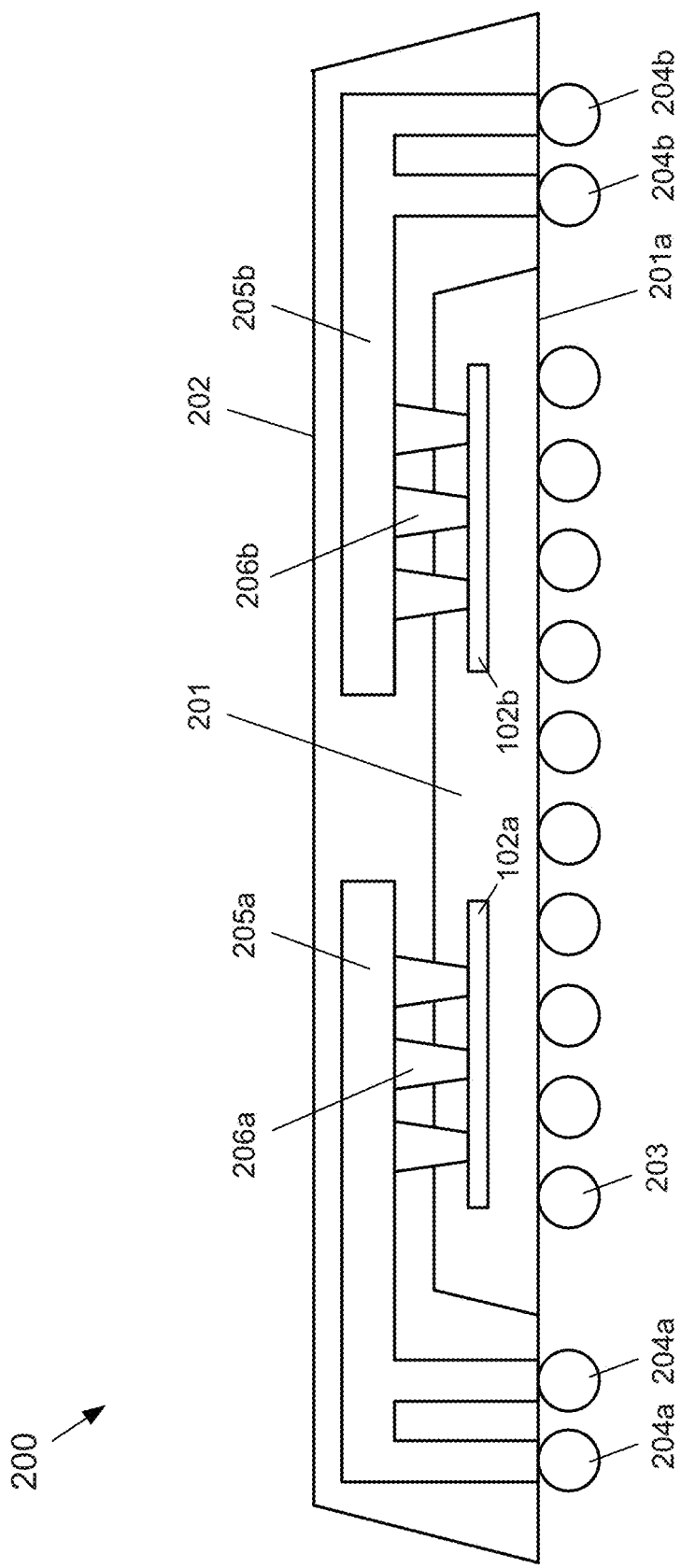
FIG. 2 depicts a cross-sectional view of an example semiconductor device that includes backside power connections according to the subject matter disclosed herein.

FIG. 2 depicts a cross-sectional view of an example semiconductor device 200 that includes backside power connections according to the subject matter disclosed herein. The semiconductor device 200 may include a semiconductor die 201 and a semiconductor package 202. In one embodiment, the semiconductor die 201 may be a flip-chip device embedded in the semiconductor package 202. That is, the top surface 201a of the semiconductor device may correspond to the top surface 101a of the substrate 101 in FIG. 1B. The semiconductor device 200 may also include an array of solder balls 203 through which electrical signals may be coupled between the semiconductor die 201 and an external device (not shown), and an array of solder balls 204 that may be used to supply power and ground to the semiconductor die 201. More specifically, solder balls 204a may couple one or more power supply voltages to a BPR 102a in the semiconductor die 201. A power supply bus structure 205a within the semiconductor device 200 may couple a power supply voltage to the BPR 102a through a back side of a substrate of the semiconductor die 201 via structures 206a. Similarly, solder balls 204b may couple a ground/return voltage to a BPR 102b in the semiconductor die 201. A ground bus structure 205b may couple a ground/return voltage to the BPR 102b through the back side of the substrate of the semiconductor die 201 via structure 206b. Although one die 201 is depicted in FIG. 2, it should be understood that one or more dies and multiple power and multiple ground rails per chip may be provided in a similar manner using backside vias connected to a BPR.

Figure 3:
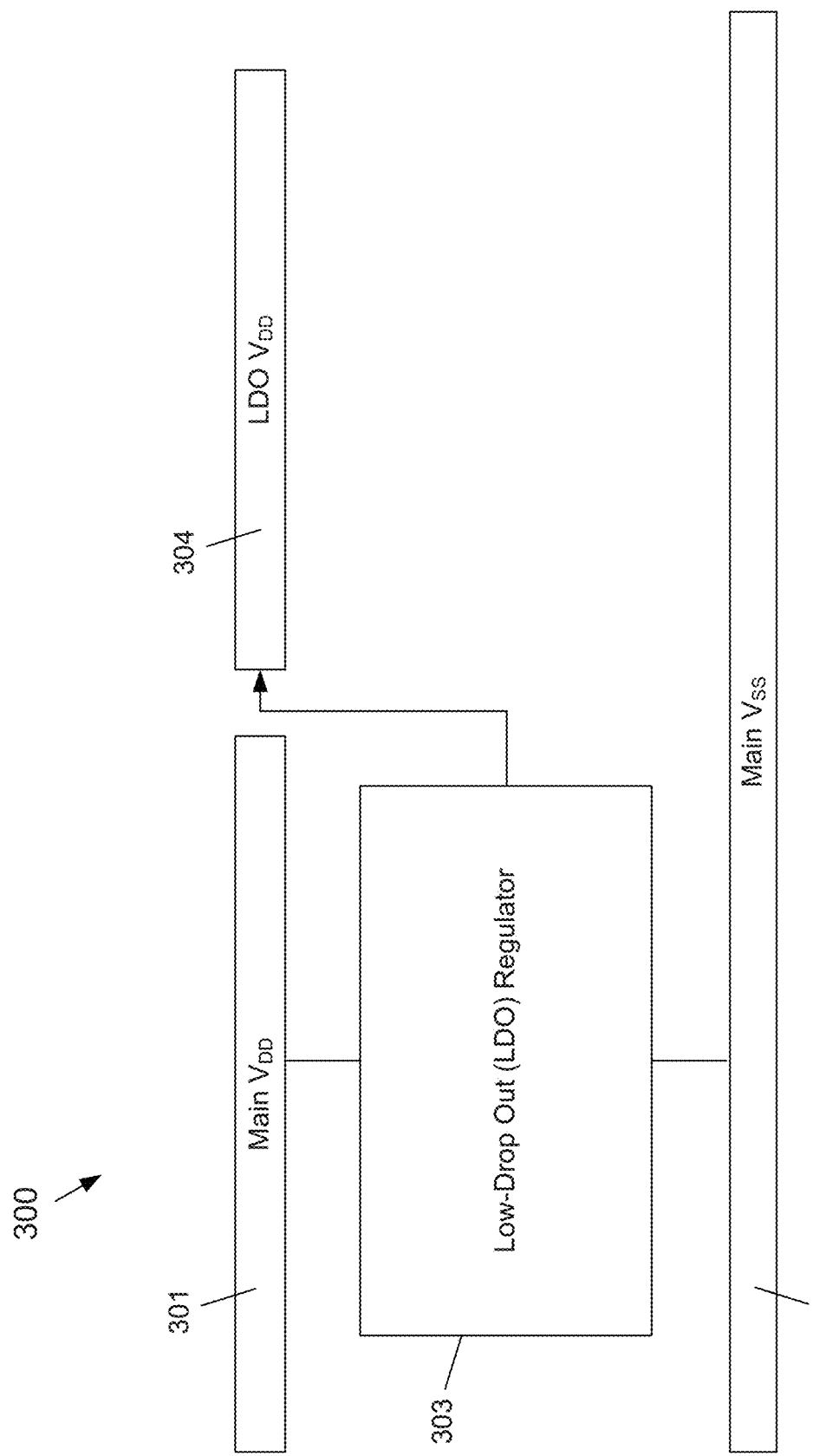
FIG. 3 depicts an example embodiment of an arrangement of BPRs in which a low-dropout (LDO) voltage may be coupled to a BPR according to the subject matter disclosed herein.

FIG. 3 depicts an example embodiment of an arrangement 300 of BPRs in which a low-dropout (LDO) voltage may be coupled to a BPR according to the subject matter disclosed herein. The arrangement 300 may include a first BPR 301 and a second BPR 302. A main power supply, such as $V_{DD}$, may be coupled to the first BPR 301, and a main ground/return supply, such as $V_{SS}$, may be coupled to the second BPR 302. An LDO regulator 303 may be coupled between the first BPR 301 and the second BPR 302, and may generate one or more voltages, such as an LDO $V_{DD}$, that may respectively be coupled to a corresponding BPR. For example, as depicted in FIG. 3, the LDO regulator 303 outputs an LDO $V_{SS}$ that is coupled to a BPR 304. Although only one LDO may be depicted in FIG. 3 as an example, it should be understood that multiple and any kind of generated power supply or ground or internal power supply node, a power-switched power supply node, or power-gated power supply node can be provided in a similar manner by creating an island of BPR buried rail that is electrically isolated from other BPR buried rails.

FIGS. 4A-4D depict example configurations a BPR and a wall-via structure according to the subject matter disclosed herein. The dashed line appearing in each of FIGS. 4A-4D represents a boundary of a standard cell when a BPR and a wall-via structure are fabricated as part of a standard-cell device.

FIG. 4A depicts a first example configuration 400 that includes a BPR 401, a wall-via structure 402, and a metal layer 403. The BPR 401 may be formed from a conductive material, such as, but not limited to, a metal, that has been deposited in a trench (not shown) in a substrate (not shown). In one embodiment, a standard cell semiconductor device, such as the example standard cell semiconductor device depicted in FIGS. 1A and 1B, may be fabricated on the substrate above the BPR 401. The semiconductor device fabricated on the substrate above the BPR 401 is not limited to being a standard-cell semiconductor device and may be a semiconductor device that is not based on a standard-cell configuration.

The wall-via structure 402 may be formed on the BPR 401 and may be formed from a conductive material, such as, but not limited to, a metal. In one embodiment, the wall-via structure 402 may be formed in a trench (not shown) formed in an intermediate layer (not shown) of the semiconductor device (not shown). The metal layer 403 may be formed on the wall-via structure 402. The wall-via structure 402 may electrically couple the BPR 401 to the metal layer 403. Additionally, a MEOL layer 404 (of which only a portion is depicted in FIG. 4A) may be electrically connected to a wall-via structure 402.

FIG. 4B depicts a second example configuration 410 that includes a BPR 411, a wall-via structure 412, and a metal layer 413. The BPR 411 may be formed from a conductive material, such as, but not limited to, a metal, that has been deposited in a trench (not shown) in a substrate (not shown). In one embodiment, a standard cell semiconductor device, such as the example standard cell semiconductor device depicted in FIGS. 1A and 1B, may be fabricated on the substrate above the BPR 411. The semiconductor device fabricated on the substrate above the BPR 411 is not limited to being a standard-cell semiconductor device and may be a semiconductor device that is not based on a standard-cell configuration.

The wall-via structure 412 may be formed on the BPR 411 and may be formed from a conductive material, such as, but not limited to, a metal. In one embodiment, the wall-via structure 402 may be formed in a trench (not shown) formed in an intermediate layer (not shown) of the semiconductor device (not shown). The wall-via structure 412 may include one or more openings or apertures 414 through which one or more metallizations may be formed that may be used to route signals and/or power lines from one side of the BPR/wall-via structure 410 to the other side. The metal layer 413 may be formed on the wall-via structure 412. The wall-via structure 412 may electrically couple the BPR 411 to the metal layer 413. An aperture 414 may provide opportunity or an option for a MEOL layer 415 (of which only a portions is depicted in FIG. 4B) to go through a wall-via structure 412 without making electrical contact with the wall-via structure, and a MEOL routing signal 416 (of which only a portion is depicted in FIG. 4B) to be optionally electrically isolated from the wall—via structure may be useful for improving routing flexibility between stdcells.

Figure 4C:
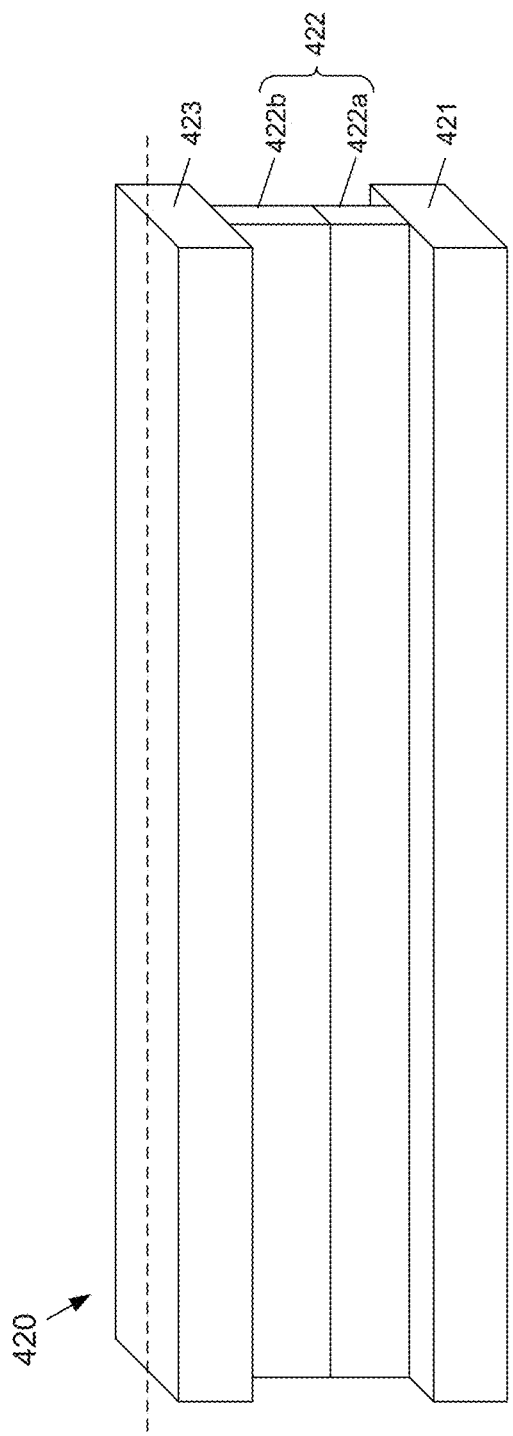

FIG. 4C depicts a third example configuration 420 that includes a BPR 421, a wall-via structure 422, and a metal layer 423. The BPR 421 may be formed from a conductive material, such as, but not limited to, a metal, that has been deposited in a trench (not shown) in a substrate (not shown). In one embodiment, a standard cell semiconductor device, such as the example standard cell semiconductor device depicted in FIGS. 1A and 1B, may be fabricated on the substrate above the BPR 421. The semiconductor device fabricated on the substrate above the BPR 421 is not limited to being a standard-cell semiconductor device and may be a semiconductor device that is not based on a standard-cell configuration.

The wall-via structure 422 may be formed on the BPR 421 and may be formed from a conductive material, such as, but not limited to, a metal. In one embodiment, the wall-via structure 422 may be formed from one or more MEOL wall-via structure, of which two wall-via structures—wall-via structures 422a and 422b—have been depicted. The wall-via structure 422 may be formed in trenches (not shown) formed in intermediate layers (not shown) of the semiconductor device (not shown). The metal layer 423 may be formed on the wall-via structure 422. The wall-via structure 422 may electrically couple the BPR 421 to the metal layer 423. Although not shown, metal traces form at intermediate levels (i.e., at a MEOL layer) may be connected directly or indirectly to the wall-via structure 422 at the corresponding level of the metal trace to create electrical connections. Such example electrical connections may be depicted in FIGS. 1A and 1B, for example, for electrical connections for the source of both nmos and pmos in the inverter depicted. Such lateral electrical connections may both save area and also create low-resistance connections. Additionally, such lateral electrical connections may be more efficient than vertical vias to connect to upper level power distribution network layers. If there is a break or an aperture in the wall-via structure, then the same MEOL traces can optionally go through the break or the aperture in the wall to allow for other electrical connections between two other signals. This flexibility in shorting a metallization to a wall-via structure or optionally going through the wall-via structure in an electrically isolated manner provides design and layout flexibility and thus provide more options for efficient signal and power connectivity.

Figure 4D:
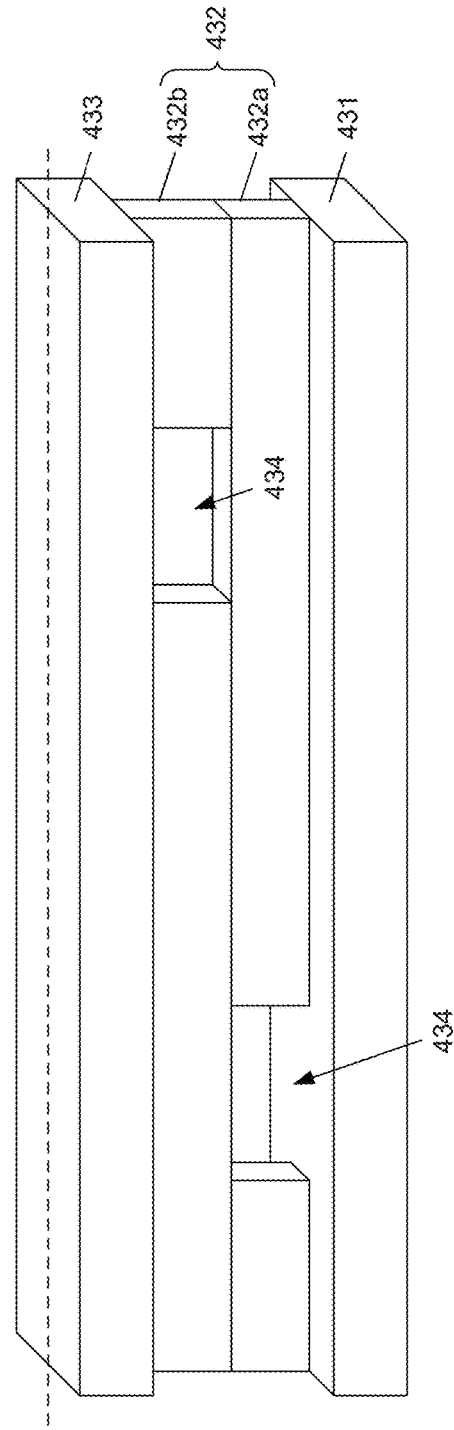

FIG. 4D depicts a fourth example configuration 430 that includes a BPR 431, a wall-via structure 432, and a metal layer 433. The BPR 431 may be formed from a conductive material, such as, but not limited to, a metal, that has been deposited in a trench (not shown) in a substrate (not shown). In one embodiment, a standard cell semiconductor device, such as the example standard cell semiconductor device depicted in FIGS. 1A and 1B, may be fabricated on the substrate above the BPR 431. The semiconductor device fabricated on the substrate above the BPR 431 is not limited to being a standard-cell semiconductor device and may be a semiconductor device that is not based on a standard-cell configuration.

The wall-via structure 432 may be formed on the BPR 431 and may be formed from a conductive material, such as, but not limited to, a metal. In one embodiment, the wall-via structure 432 may be formed from one or more MEOL wall-via structures, of which two wall-via structures—wall-via structures 432a and 432b—have been depicted. The wall-via structure 432 may be formed in trenches (not shown) formed in intermediate layers (not shown) of the semiconductor device (not shown). The wall-via structures 432a and 432b may each include one or more openings or apertures 434 through which one or more metallizations may be formed that may be used to route signals and/or power lines from one side of the BPR/wall-via structure 430 to the other side. Although FIG. 4D shows two sets of MEOL layers 432a and 432b, in principle three or more layers may also be used depending on the preference of manufacturing technology, design flexibility needs and the overall MEOL architecture in a chosen technology. The metal layer 433 may be formed on the wall-via structure 432. The wall-via structure 432 may electrically couple the BPR 431 to the metal layer 433. Although not shown, metal traces form at intermediate levels (i.e., at a MEOL layer) may be connected directly or indirectly to the wall-via structure 432 at the corresponding level of the metal trace, such as previously described. Additionally, one or more signal layers (not shown) and/or one or more power distribution network connections (not shown) may pass through an aperture 434 without making electrical contact with the wall-via structure 430.

Figure 5A:
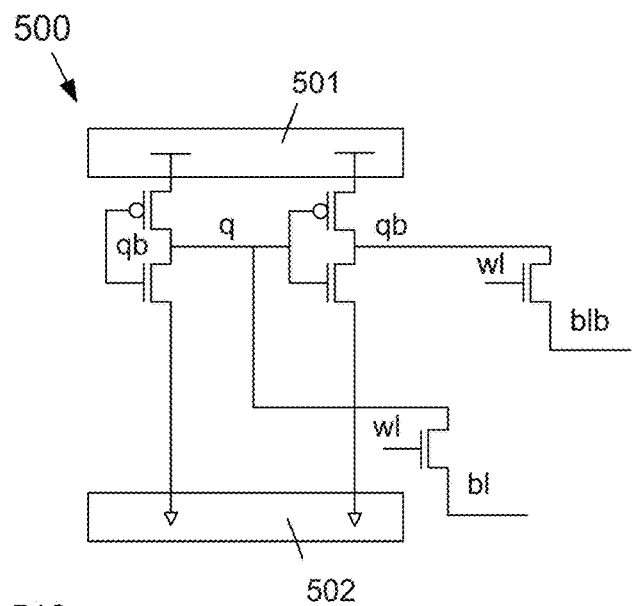
FIG. 5A depicts a schematic diagram of an example embodiment of a standard-cell semiconductor device configured as a memory cell according to the subject matter disclosed herein.

FIG. 5A depicts a schematic diagram of an example embodiment of a semiconductor device configured as a memory cell 500 according to the subject matter disclosed herein. The memory cell 500 may include a BPR 501 and a BPR 502, similar to those depicted in FIGS. 1A and 1B.

Figure 5B:
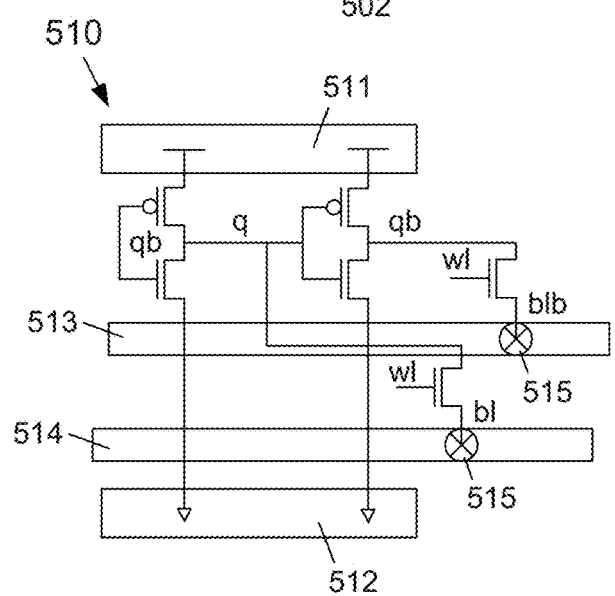
FIG. 5B depicts a schematic diagram of a second example embodiment of a standard-cell semiconductor device configured as a memory cell according to the subject matter disclosed herein.

In addition to distributing power signals, buried rails may also be used to route signals. FIG. 5B depicts a schematic diagram of a second example embodiment of a semiconductor device configured as a memory cell 510 according to the subject matter disclosed herein. The memory cell 510 may include a BPR 511 and a BPR 512, similar to those depicted in FIGS. 1A and 1B. The memory cell may also include bit lines 513 and 514 that are buried in a substrate on which the memory cell 510 has been fabricated. Trenches may be formed in the substrate for the bit lines and metal deposited in the trenches to form the buried bit lines. A dielectric or insulating layer may be formed on the surface of each buried bit line to electrically isolate the buried bit line as needed and epitaxial silicon may be grown on the dielectric layer so that transistors of the memory cell 510 may be fabricated. Vias 515 may connect directly or indirectly to the buried bit lines 513 and 514 to circuitry in the memory cell 510.

Figure 5C:
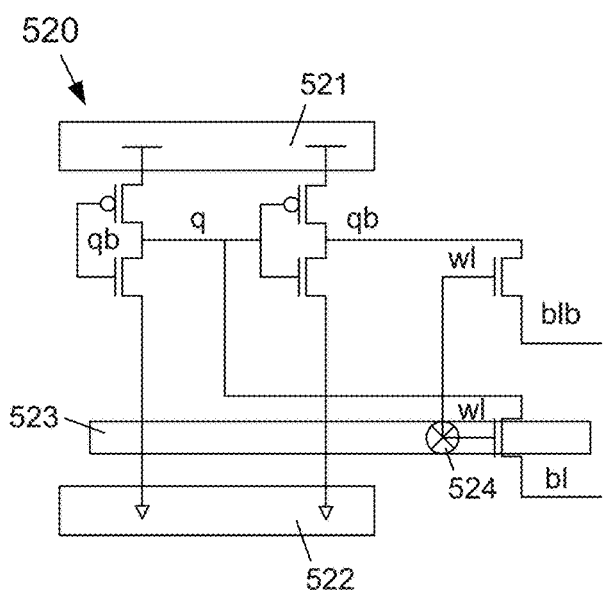
FIG. 5C depicts a schematic diagram of a third example embodiment of a standard-cell semiconductor device configured as a memory cell according to the subject matter disclosed herein.

FIG. 5C depicts a schematic diagram of a third example embodiment of a semiconductor device configured as a memory cell 520 according to the subject matter disclosed herein. The memory cell 520 may include a BPR 521 and a BPR 522, similar to those depicted in FIGS. 1A and 1B. A word line 523 may be buried in a substrate on which the memory cell 510 has been fabricated. A trench may be formed in the substrate for the word line and metal deposited in the trench to form the buried word line. A dielectric layer may be formed on the surface of the buried word line and epitaxial silicon may be grown on the dielectric layer so that transistors of the memory cell 520 may be fabricated. A via 524 may connect the buried word line 523 to circuitry in the memory cell 520. While examples of static random access memory (SRAM) bitcells are used for FIGS. 5A-5C, in general buried rails may be used for any global signal routing, such as, but not limited to, clocks/resets/enables and other signals in trenches below the substrate.

Some example design rules for 5T standard cells that utilize the BPR follow. As evident from FIG. 1A, the tip of a MEOL layer 112 (sometimes referred herein as CA) to wall—via structure spacing, tip to tip spacing of CA layer 112 in one cell to CA MEOL layer in adjacent cell, gate layer 107 to wall via spacing, Diffusion break 115 (SDB or DDB) to wall via spacing, Maximum run length of wall via without a break or aperture, minimum aperture size in wall via, etc., may be some of the wall—via structure specific design rules to consider for manufacturing process yield and stdcell design optimizations. This list is given as examples, and is not exhaustive.

Figure 6:
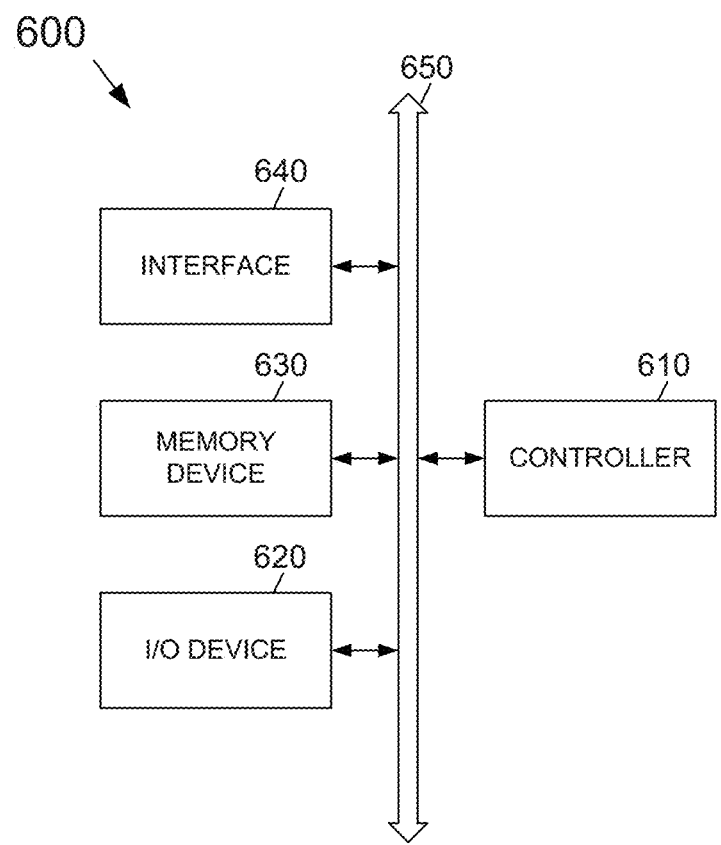
FIG. 6 depicts an electronic device that includes one or more standard-cell devices utilizing BPR technology according to the subject matter disclosed herein.

FIG. 6 depicts an electronic device 600 that includes one or more semiconductor devices utilizing BPR technology according to the subject matter disclosed herein. Electronic device 600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 600 may include a controller 610, an input/output device 620 such as, but not limited to, a keypad, a keyboard, a display, a touch-screen display, a camera, and/or an image sensor, a memory 630, and an interface 640 that are coupled to each other through a bus 650. The controller 610 may include, for example, at least one microprocessor, at least one digital signal process, at least one microcontroller, or the like. The memory 630 may be configured to store a command code to be used by the controller 610 or a user data. Electronic device 600 and the various system components of electronic device 600 may include one or more semiconductor devices utilizing BPR technology according to the subject matter disclosed herein. The interface 640 may be configured to include a wireless interface that is configured to transmit data to or receive data from a wireless communication network using a RF signal. The wireless interface 640 may include, for example, an antenna, a wireless transceiver and so on. The electronic system 600 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices).

The operations described in this specification may be implemented as operations performed by a data-processing apparatus on data stored on one or more computer-readable storage devices or received from other sources.

The term "data-processing apparatus" encompasses all kinds of apparatus, devices and machines for processing data, including by way of example, a programmable processor, a computer, a system on a chip, or multiple ones, or combinations, of the foregoing The apparatus may include special-purpose logic circuitry, e.g., an FPGA (field programmable gate array) or an ASIC (application-specific integrated circuit). The apparatus may also include, in addition to hardware, code that creates an execution environment for the computer program, e.g., code that constitutes processor firmware, a protocol stack, a database-management system, an operating system, a cross-platform runtime environment, a virtual machine, or a combination thereof. The apparatus and execution environment may realize various different computing model infrastructures, such as web services, distributed computing and grid computing infrastructures.

A computer program (also known as a program, software, software application, script, or code) may be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus can also be implemented as, special-purpose logic circuitry, e.g., an FPGA (field programmable gate array) or an ASIC (application-specific integrated circuit).

Processors suitable for the execution of a computer program include, by way of example, both general-purpose and special-purpose microprocessors, and any one or more processors of any kind of digital computer. Generally, a processor may receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. A computer, however, need not have such devices. Moreover, a computer may be embedded in another device, e.g., a mobile telephone, a personal-digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in, special-purpose logic circuitry.

To provide for interaction with a user, embodiments of the subject matter described in this specification may be implemented on a computer having a display device, e.g., a CRT (cathode ray tube) or LCD (liquid crystal display) monitor, for displaying information to the user and a keyboard and a pointing device, e.g., a mouse or a trackball, with which the user can provide input to the computer. Other kinds of devices can be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the subject matter described in this specification may be implemented in a computing system that includes a back-end component, e.g., as a data server, or that includes a middleware component, e.g., an application server, or that includes a front-end component, e.g., a user computer having a graphical user interface or a Web browser through which a user may interact with an implementation of the subject matter described in this specification, or any combination of one or more such back-end, middleware, or front-end components. The components of the system may be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system may include users and servers. A user and a server are generally remote from each other and typically interact through a communication network. The relationship of user and server arises by virtue of computer programs running on the respective computers and having a user-server relationship to each other.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments may also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims may be performed in a different order and still achieve desirable results. In addition, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:
1. A semiconductor device, comprising:
   a substrate having a top surface;
   one or more transistors disposed above the top surface of the substrate;

a metal layer disposed above the top surface of the substrate;

one or more buried power rails in one or more corresponding trenches in the substrate below the top surface of the substrate, a top surface of at least one buried power rail being at the top surface of the substrate, and a first buried power rail being at a first predetermined electrical potential; and at least one wall-via structure extending between the first buried power rail and the metal layer, the wall-via structure electrically connecting the first buried power rail to the metal layer.

2. The semiconductor device of claim 1, wherein the wall-via structure comprises a plurality of intermediate metallization, middle end of line (MEOL) or middle of line (MOL) layers sandwiched between the first buried power rail and the metal layer.

3. The semiconductor device of claim 1, wherein the wall-via structure comprises a length extending in a direction that is substantially perpendicular to a direction extending between the first buried power rail and the metal layer and that is greater than or equal to 4 times a basic length unit for components in layers between the first buried power rail and the metal layer, the basic length unit being half of a smallest middle of the line (MEOL) pitch based on minimum spacing design rules for the semiconductor device.

4. The semiconductor device of claim 1, wherein the first predetermined electrical potential comprises one of a power supply voltage and a ground electrical potential.

5. The semiconductor device of claim 1, wherein the first buried power rail is coupled to the first predetermined electrical potential from a back surface of the substrate that is opposite to the top surface of the substrate.

6. The semiconductor device of claim 5, further comprising at least one well tie structure coupling the wall-via structure to a well structure in the substrate.

7. The semiconductor device of claim 1, further comprising one or more buried signal lines in one or more corresponding trenches in the substrate below the top surface of the substrate, at least one of the buried signal lines being electrically coupled to the semiconductor device.

8. The semiconductor device of claim 1, wherein the wall-via structure comprises a gap through which at least one of a signal line and a power supply line passes.

9. The semiconductor device of claim 1, wherein the first predetermined electrical potential comprises an output voltage of one of an on-die generated local power supply, a power-switched, and power-gated power supply.

10. A standard-cell semiconductor device, comprising:
a substrate having a top surface;
one or more transistors disposed above the top surface of the substrate;
a metal layer disposed above the top surface of the substrate;
one or more buried power rails in one or more corresponding trenches in the substrate below the top surface of the substrate, a top surface of at least one buried power rail being at the top surface of the substrate, a first buried power rail being at a first power supply voltage, and a second buried power rail being at a ground potential; and
a wall-via structure extending between the first buried power rail and a first trace in the metal layer, the wall-via structure electrically connecting the first buried power rail to the first trace in the metal layer, the wall-via structure comprising a plurality of intermediate metal layers sandwiched between the first buried power rail and the metal layer.

11. The standard-cell semiconductor device of claim 10, wherein the wall-via structure further comprises a length extending in a direction that is substantially perpendicular to a direction extending between the first buried power rail and the metal layer and that is greater than or equal to 4 times a basic length unit for components in layers between the first buried power rail and the metal layer, the basic length unit being half of a smallest middle of the line (MEOL) pitch based on minimum spacing design rules for the standard-cell semiconductor device.

12. The standard-cell semiconductor device of claim 10, wherein the first power supply voltage comprises an output voltage of one of an on-die generated local power supply, a power-switched, and power-gated power supply.

13. The standard-cell semiconductor device of claim 10, wherein at least the first buried power rail is coupled to the first power supply voltage from a back surface of the substrate that is opposite the top surface of the substrate.

14. The standard-cell semiconductor device of claim 10, further comprising a well tie structure coupling the wall-via structure to a well structure in the substrate.

15. The standard-cell semiconductor device of claim 10, further comprising one or more buried signal lines in one or more corresponding trenches in the substrate below the top surface of the substrate, at least one of the buried signal lines being electrically coupled to the standard-cell semiconductor device.

16. The standard-cell semiconductor device of claim 10, wherein the wall-via structure comprises a gap through which at least one of a signal line and a power supply line passes.

17. A semiconductor device, comprising:
a substrate having a top surface;
one or more transistors disposed above the top surface of the substrate;
a metal layer disposed above the top surface of the substrate;
one or more buried power rails in one or more corresponding trenches in the substrate below the top surface of the substrate, a top surface of at least one buried power rail being at the top surface of the substrate, and a first buried power rail being coupled to a first predetermined electrical potential; and
a wall-via structure extending between the first buried power rail and a first trace in the metal layer, the wall-via structure electrically connecting the first buried power rail to the first trace in the metal layer, the wall-via structure comprising a length extending in a direction that is substantially perpendicular to a direction extending between the first buried power rail and the metal layer and that is greater than or equal to 4 times a basic length unit for components in layers between the first buried power rail and the metal layer, the basic length unit being half of a smallest middle of the line (MEOL) pitch based on minimum spacing design rules for the semiconductor device.

18. The semiconductor device of claim 17, wherein the first predetermined electrical potential comprises one of a power supply voltage and a ground electrical potential.

19. The semiconductor device of claim 17, wherein at least the first buried power rail is coupled to the first predetermined electrical potential from a back surface of the substrate that is opposite the top surface of the substrate.

20. The semiconductor device of claim 17, further comprising one or more buried signal lines in one or more corresponding trenches in the substrate below the top surface of the substrate, at least one of the buried signal lines being electrically coupled to the semiconductor device.

\* \* \* \* \*